(12) United States Patent
Sugawara

(10) Patent No.: US 8,541,772 B2
(45) Date of Patent: Sep. 24, 2013

(54) NITRIDE SEMICONDUCTOR STACKED STRUCTURE AND METHOD FOR MANUFACTURING SAME AND NITRIDE SEMICONDUCTOR DEVICE

(75) Inventor: Hideto Sugawara, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 13/223,853

(22) Filed: Sep. 1, 2011

(65) Prior Publication Data

US 2012/0211784 A1 Aug. 23, 2012

(30) Foreign Application Priority Data

Feb. 18, 2011 (JP) ................ 2011-033725

(51) Int. Cl.
*H01L 29/06* (2006.01)
*H01L 31/00* (2006.01)
(52) U.S. Cl.
USPC ........... 257/22; 257/79; 257/E33.033; 438/40
(58) Field of Classification Search
USPC ................ 257/9–18, 21, 79–99, 431–436, E33.001–E33.008, E33.025, E33.026–E33.028, 257/E33.03–E33.034; 438/22, 27, 28, 29, 438/30, 31, 32, 39, 40–44
See application file for complete search history.

(56) References Cited

U.S. PATENT DOCUMENTS

2010/0025684 A1 2/2010 Shinohara et al.

FOREIGN PATENT DOCUMENTS

JP 2009-124174 6/2009

OTHER PUBLICATIONS

Kazuyuki, T., et al., "High Output Power InGaN Ultraviolet Light-Emitting Diodes Fabricated on Patterned Substratates Using Metalorganic Vapor Phase Epitaxy" Jpn, J. Appl. Phys. vol. 40 (2001) pp. L583-L585.

*Primary Examiner* — Julio J Maldonado
*Assistant Examiner* — Sonya D McCall Shepard
(74) *Attorney, Agent, or Firm* — White & Case LLP

(57) ABSTRACT

According to one embodiment, a nitride semiconductor stacked structure having a first surface includes a substrate, a first buffer layer, a first crystal layer, a second buffer layer and a second crystal layer. A step portion is provided in the substrate and includes an upper surface, a lower surface, and a side surface between the upper surface and the lower surface. The first buffer layer includes $In_sAl_tGa_{1-s-t}N$ ($0 \leq s \leq 0.05$, $0 \leq t \leq 1$) and covers the lower surface and the side surface. The first crystal layer is provided on the first buffer layer, includes $In_sAl_tGa_{1-s-t}N$ ($0 \leq s \leq 0.05$, $0 \leq t \leq 0.05$), and has an upper surface provided above the upper surface of the substrate. The second buffer layer includes $In_sAl_tGa_{1-s-t}N$ ($0 \leq s \leq 0.05$, $0 \leq t \leq 1$) and continuously covers the upper surface of the first crystal layer and the upper surface of the substrate. The second crystal layer covers the second buffer layer, includes $In_sAl_tGa_{1-s-t}N$ ($0 \leq s \leq 0.05$, $0 \leq t \leq 0.05$), and has the first surface.

17 Claims, 7 Drawing Sheets

NITRIDE SEMICONDUCTOR STACKED STRUCTURE AND METHOD FOR MANUFACTURING SAME AND NITRIDE SEMICONDUCTOR DEVICE

CROSS-REFERENCE TO RELATED APPLICATIONS

This application is based upon and claims the benefit of priority from the prior Japanese Patent Application No. 2011-033725, filed on Feb. 18, 2011; the entire contents of which are incorporated herein by reference.

FIELD

Embodiments described herein relate generally to a nitride semiconductor stacked structure and a method for manufacturing the same and a nitride semiconductor device.

BACKGROUND

Nitride semiconductors have a bandgap energy in the range of 0.7-6.2 eV, and can be widely used for light emitting devices, high frequency devices and high power devices.

For instance, in the case of using a material of $In_xGa_{1-x}N$ ($0 \leq x \leq 1$) for a light emitting device, by changing the In composition ratio x, the bandgap can be controlled to between 3.4 eV of GaN and 0.7 eV of InN. Thus, a high brightness visible light emitting device can be obtained.

However, there is no substrate material which is easily lattice matched with and close in thermal expansion coefficient to nitride semiconductors. Thus, sapphire is often used, which has high stability in the crystal growth atmosphere and has high volume productivity.

In this case, strain due to difference in lattice constant occurs. Furthermore, strain due to difference in thermal expansion coefficient occurs in the temperature decreasing process after crystal growth. Thus, a nitride crystal layer includes many crystal defects.

On the other hand, a step portion provided in the substrate facilitates improving the characteristics of the semiconductor device. For instance, in a light emitting device, concave-convex structure provided at the surface of the substrate can change the traveling direction of light, and can increase the light extraction efficiency. However, a step portion provided at the surface of the substrate may increase the crystal defect density and cause the problem of degrading the characteristics of the light emitting device.

DETAILED DESCRIPTION

In general, according to one embodiment, a nitride semiconductor stacked structure having a first surface on which a semiconductor including $In_xAl_yGa_{1-x-y}N$ ($0 \leq x \leq 1$, $0 \leq y \leq 1$, $x+y \leq 1$) can be stacked is provided. The structure includes a substrate, a first buffer layer, a first crystal layer, a second buffer layer and a second crystal layer. A step portion is provided in the substrate. The step portion includes an upper surface, a lower surface, and a side surface between the upper surface and the lower surface. The first buffer layer includes $In_sAl_tGa_{1-s-t}N$ ($0 \leq s \leq 0.05$, $0 \leq t \leq 1$) and covers the lower surface and the side surface. The first crystal layer is provided on the first buffer layer, includes $In_sAl_tGa_{1-s-t}N$ ($0 \leq s \leq 0.05$, $0 \leq t \leq 0.05$), and has an upper surface provided above the upper surface of the substrate. The second buffer layer includes $In_sAl_tGa_{1-s-t}N$ ($0 \leq s \leq 0.05$, $0 \leq t \leq 1$) and continuously covers the upper surface of the first crystal layer and the upper surface of the substrate. The second crystal layer covers the second buffer layer, includes $In_sAl_tGa_{1-s-t}N$ ($0 \leq s \leq 0.05$, $0 \leq t \leq 0.05$), and has the first surface.

Various embodiments will be described hereinafter with reference to the accompanying drawings.

Figure 1A:
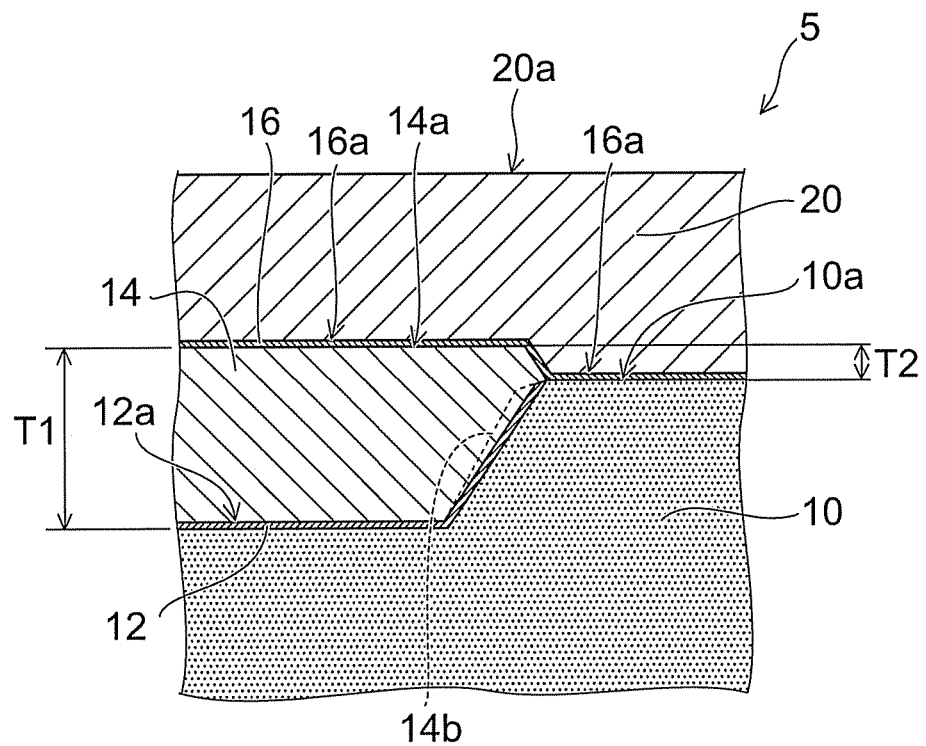
FIG. 1A is a schematic sectional view of a nitride semiconductor stacked structure according to a first embodiment.
Figure 1B:
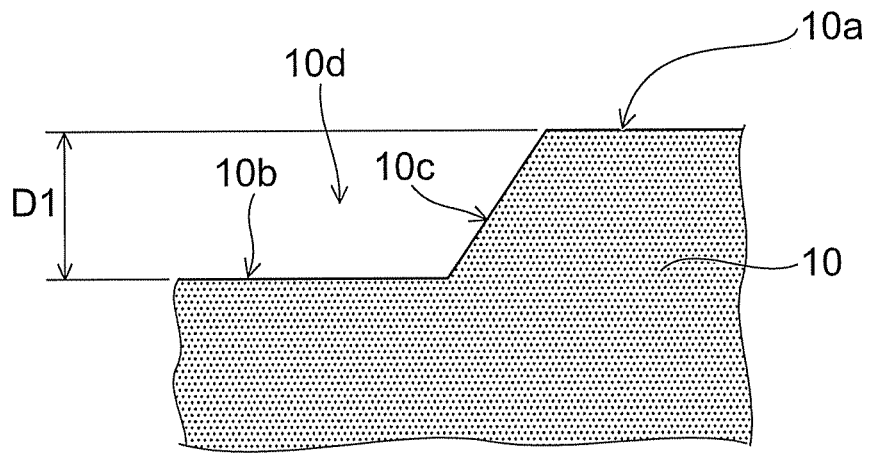
FIG. 1B is a schematic view showing a step portion of the substrate.

FIG. 1A is a schematic sectional view of a nitride semiconductor stacked structure according to a first embodiment. FIG. 1B is a schematic view showing a step portion of the substrate.

As shown in FIG. 1A, the nitride semiconductor stacked structure 5 includes a substrate 10, a first buffer layer 12, a first crystal layer 14, a second buffer layer 16, and a second crystal layer 20. On the nitride semiconductor stacked structure 5, a stacked body including nitride semiconductors can be formed by the crystal growth method to obtain a light emitting device or electronic device.

In the specification, the nitride semiconductor refers to a material represented by the composition formula $In_xGa_yAl_{1-x-y}N$ (where $0 \leq x \leq 1$, $0 \leq y \leq 1$, $x+y \leq 1$), which may contain elements serving as acceptors or donors.

As shown in FIG. 1B, the substrate 10 is made of e.g. sapphire, SiC, or Si, and has a step portion 10d.

More specifically, for instance, the substrate 10 has an upper surface 10a, a lower surface, and a side surface. The lower surface represents a step lower surface 10b of the step portion 10d provided below the upper surface 10a. The side surface represents a step side surface 10c. If the substrate 10 is made of sapphire, the upper surface 10a and the step lower surface 10b can be hexagonal c-planes (0001).

The first buffer layer 12 includes GaN, and is provided so as to cover the step lower surface 10b and the step side surface 10c. The first crystal layer 14 is provided on the upper surface 12a of the first buffer layer 12. The first crystal layer 14 has an upper surface 14a located above the upper surface 10a of the substrate 10 and includes GaN. That is, the sum T1 of thickness of the first buffer layer 12 and the first crystal layer 14 is larger than the height D1 of the step portion 10d.

The second buffer layer 16 includes GaN and continuously covers the upper surface 14a of the first crystal layer 14 and the upper surface 10a of the substrate 10. The second crystal layer 20 including GaN is provided so as to cover the upper surface 16a of the second buffer layer 16. The step at its surface 20a is made smaller than the height difference T2 between the upper surface 14a of the first crystal layer 14 and the upper surface 10a of the substrate 10. Thus, the surface 20a can be made close to a flat surface. Hence, a stacked body made of nitride semiconductors can be provided on the upper surface 20a of the second crystal layer 20 to obtain an electronic device or light emitting device.

In the case where the substrate 10 is made of e.g. sapphire, SiC, or Si, the first buffer layer 12 and the second buffer layer 16 are not limited to GaN, but may include $In_sAl_tGa_{1-s-t}N$ ($0 \leq s \leq 0.05$, $0 \leq t \leq 1$). The first crystal layer 14 and the second crystal layer 20 are not limited to GaN, but may include $In_sAl_tGa_{1-s-t}N$ ($0 \leq s \leq 0.05$, $0 \leq t \leq 0.05$).

Figure 2A:
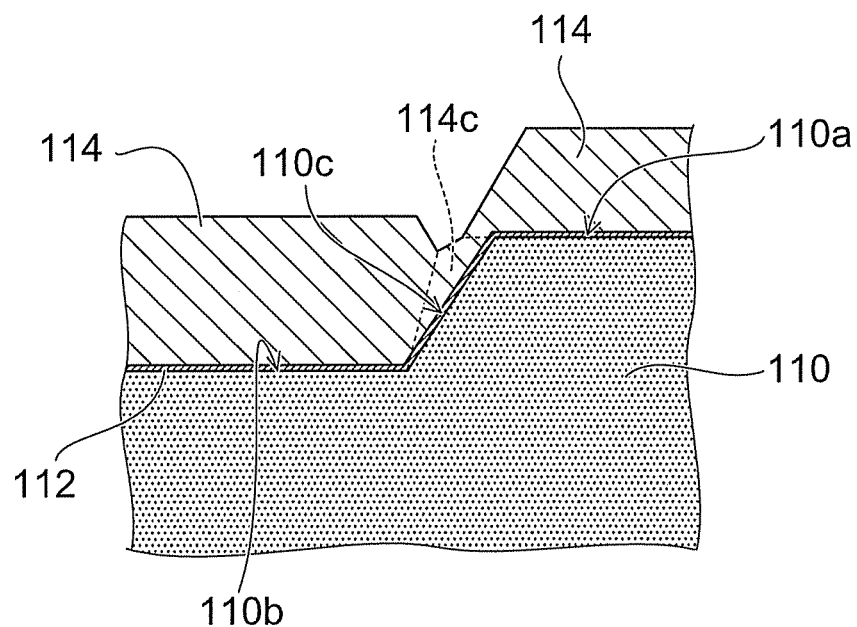
FIG. 2A is a schematic sectional view of a nitride semiconductor stacked structure according to a comparative example in the manufacturing process and FIG. 2B is a schematic sectional view after the completion of the manufacturing process.
Figure 2B:
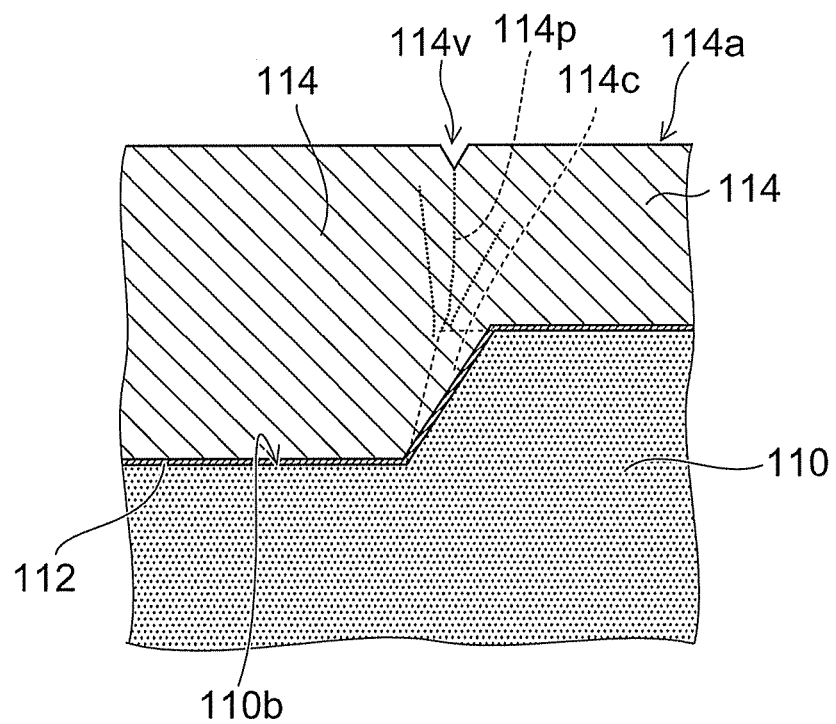

FIG. 2A is a schematic sectional view of a nitride semiconductor stacked structure according to a comparative example in the manufacturing process. FIG. 2B is a schematic sectional view after the completion of the manufacturing process.

The substrate 110 is made of sapphire, and its structure is the same as shown in FIG. 1B. A buffer layer 112 including GaN is provided on the upper surface 110a of the substrate 110, the lower surface 110b of the step portion, and the side surface 110c of the step portion.

On the upper surface of the buffer layer 112 provided on the substrate 110 having the step portion, a growth raw material is uniformly supplied to form a GaN crystal layer 114. In this case, part of the growth raw material supplied to the upper surface 110a side of the substrate 110 is supplied to the lower surface 110b side of the step portion by spreading. Thus, the growth rate of the GaN crystal layer 114 on the buffer layer 112 on the lower surface 110b of the step portion is made higher than the growth rate of the GaN crystal layer 114 on the buffer layer 112 on the upper surface 110a of the substrate 110.

Hence, as shown in FIG. 2A, the thickness of the GaN crystal layer 114 on the lower surface 110b of the step portion is larger than the thickness of the GaN crystal layer 114 provided on the upper surface 110a of the substrate 110. As a result, as shown in FIG. 2B, the step is reduced, and a GaN crystal layer 114 having a nearly flat surface can be formed.

However, the orientation axis of the crystal grown on the side surface 110c of the step portion is different from the orientation axis of the crystal grown on the c-plane. Furthermore, the growth condition on the side surface 110c is difficult to match with the growth condition on other surfaces such as the c-plane. Thus, as shown in FIG. 2A, on the side surface 110c, an abnormal growth region 114c having high crystal defect density occurs (indicated by dashed lines). That is, even if the upper surface 114a of the GaN crystal layer 114 can be made close to a flat surface, a threading dislocation 114p starting from the abnormal growth region 114c and a V-shaped pit (V-pit) 114v are likely to occur. Furthermore, dislocations which do not reach the surface may also exist inside. If the crystal layer is grown thickly, or if a mask layer is provided so as to suppress the generated crystal defects from propagating to the surface, the crystal defect density can be reduced. However, this increases the number of process steps and prolongs the growth time, thereby decreasing the volume productivity.

In the device formed in the nitride semiconductor stacked body provided on the nitride semiconductor stacked structure including such an abnormal growth region, the characteristics and reliability are not satisfactory. For instance, in the case where the stacked body includes an active layer, the crystal defect having reached the active layer produces e.g. a nonradiative recombination center. This often causes degradation including optical output decrease during operation. Furthermore, in the region having high crystal defect density, electric field concentration is likely to occur. This often decreases the electrostatic breakdown voltage.

Figure 3A:
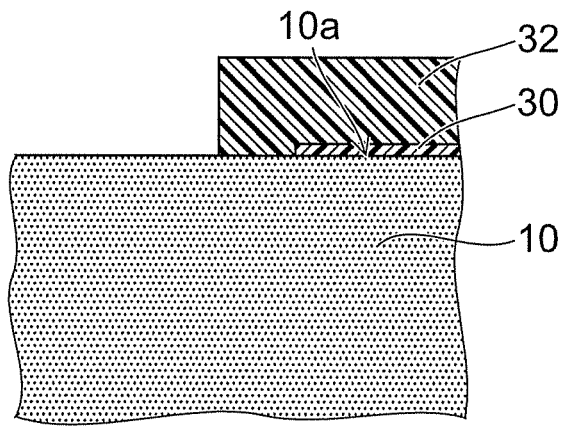
FIG. 3A to FIG. 3C are process sectional views of a process for forming a step portion in the substrate.
Figure 3B:
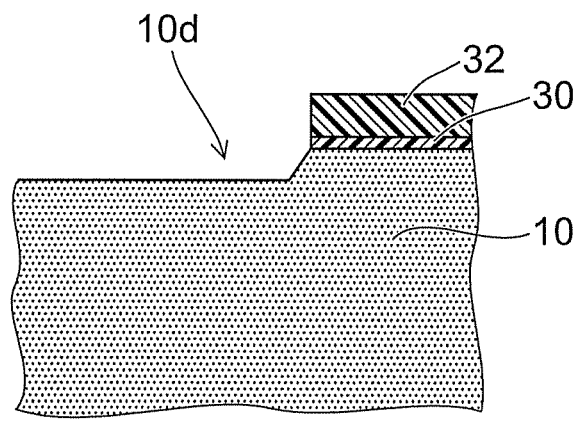
Figure 3C:
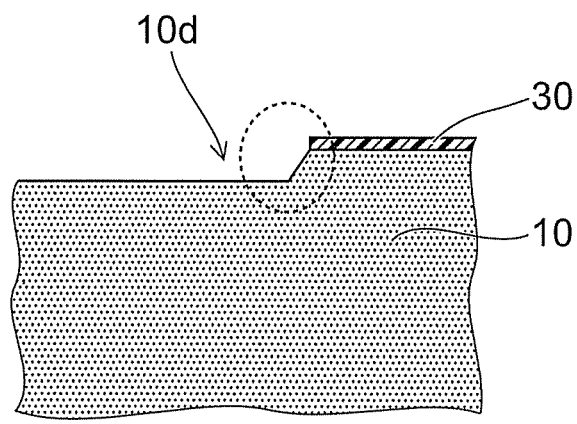

FIG. 3A to FIG. 3C are process sectional views up to forming a step portion in the substrate in the first embodiment.

In FIG. 3A, on part of the upper surface 10a of the substrate 10 made of sapphire, a selective growth mask layer 30 made of e.g. $SiO_2$ is formed. A photoresist film 32 is patterned so as to have a large area, including the selective growth mask layer 30 inside. Then, the surface of the photoresist film 32 and the substrate 10 not covered with the mask is set back. Specifically, for instance, by using reactive ion etching (RIE) and properly selecting the etching selection ratio, the substrate 10 is etched from the surface side, and the photoresist film 32 is also etched from the upper surface and the side surface. Accordingly, a step portion 10d having a sloped side surface is formed in the substrate 10.

As shown in FIG. 3B, with the progress of etching, the side surface of the selective growth mask layer 30 appears. Then, the etching is stopped. Furthermore, as shown in FIG. 3C, the photoresist film 32 is removed, and the upper surface 10a of the substrate 10 is exposed. That is, the selective growth mask layer 30 also serves as an etching mask layer in forming the step portion 10d. Then, as indicated by the dashed line, the step side surface 10c can be sloped. Thus, in the subsequent process, a crystal growth layer can be reliably grown on the step side surface 10c.

FIG. 4A to FIG. 4F are process sectional views of a method for manufacturing the nitride semiconductor stacked structure of the first embodiment.

Figure 4A:
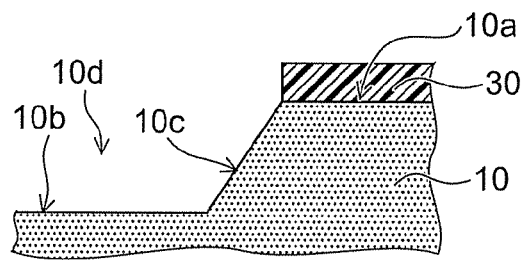
FIG. 4A to FIG. 4F are process sectional views of a method for manufacturing the nitride semiconductor stacked structure of the first embodiment.

In FIG. 4A enlarging the dashed line portion of FIG. 3C, the thickness of the substrate 10 made of sapphire is e.g. 150 μm. A first buffer layer 12 including e.g. GaN is formed on the step lower surface 10b and the step side surface 10c. The first buffer layer 12 is formed to a thickness of e.g. 0.03 μm at a temperature lower than the crystal growth temperature of the single crystal nitride semiconductor to be provided thereon. Here, the crystal growth condition is preferably such that the first buffer layer 12 is not substantially formed on the upper surface 30a of the selective growth mask layer 30.

Figure 4B:
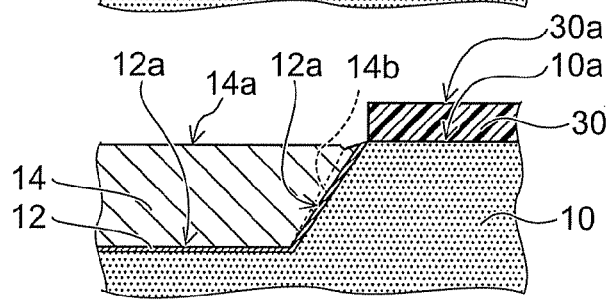
Figure 4C:
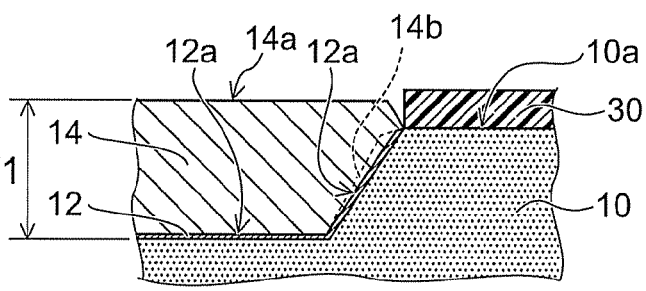

Next, a first crystal layer 14 including e.g. GaN is formed on the upper surface 12a of the first buffer layer 12 at 1000° C. or more, which is a temperature enabling crystal growth. FIG. 4B shows an intermediate process of crystal growth. In FIG. 4C, the first crystal layer 14 is formed so that the upper surface 14a of the first crystal layer 14 is made higher than the upper surface 10a of the substrate 10. For instance, the first crystal layer 14 is formed so that the sum T1 of thickness of the first buffer layer 12 and the first crystal layer 14 reaches 1 μm.

In the raw material uniformly supplied to the surface of the substrate 10, the raw material having passed above the selective growth mask layer 30 is supplied to the step lower surface 10b in a larger amount. Thus, the raw material supplied to the step lower surface 10b is made even more than that to the step lower surface 110b of the comparative example of FIGS. 2A and 2B. Hence, a higher growth rate is achieved.

As shown in FIG. 4C, when the upper surface 14a of the first crystal layer 14 reaches above the upper surface 10a of the substrate 10, the crystal growth is temporarily stopped. In this case, the crystal growth rate on the step lower surface 10b is higher. Hence, the crystal growth rate of the crystal covering the step side surface 10c is also higher. This can decrease the crystal defect region in the growth layer on the step side surface 10c.

Figure 4D:
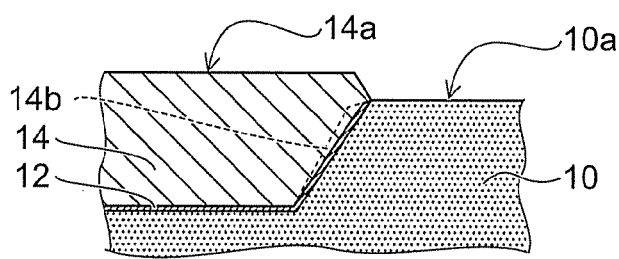
Figure 4E:
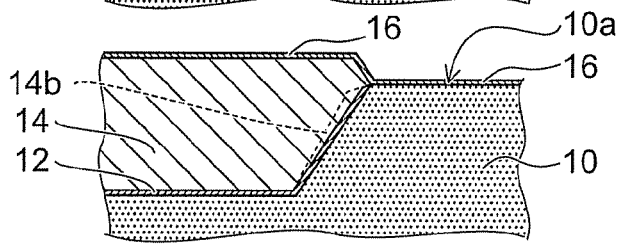

Next, as shown in FIG. 4D, the selective growth mask layer 30 is removed, and the upper surface 10a of the substrate 10 is exposed. Furthermore, as shown in FIG. 4E, a second buffer layer 16 including e.g. GaN is formed on the upper surface 14a of the first crystal layer 14 and the upper surface 10a of the substrate 10. The second buffer layer 16 is formed to a thickness of e.g. 0.03 μm at a temperature lower than the growth temperature of the first crystal layer 14.

Figure 4F:
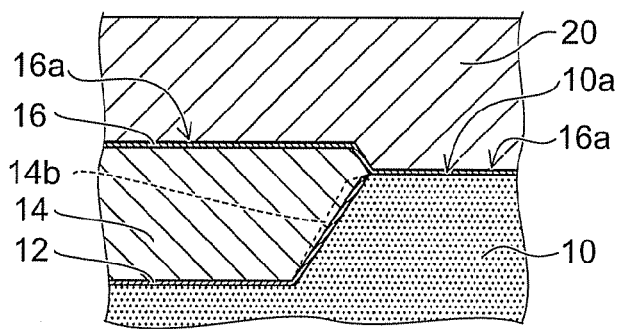

Furthermore, as shown in FIG. 4F, a second crystal layer 20 including e.g. GaN is formed on the upper surface 16a of the second buffer layer 16 to a thickness of e.g. 2 μm. The growth temperature of the second crystal layer 20 is made higher than any of the temperature for forming the first buffer layer 12 and the temperature for forming the second buffer layer 16, and is set to 1000° C. or more, which is a temperature enabling crystal growth. Here, the second buffer layer 16 is provided between the second crystal layer 20 and the first crystal layer 14. Hence, these crystal layers are not vertically continuous. In this case, more raw material gas is supplied to the upper surface of the second buffer layer 16 on the upper surface 10a of the substrate 10. Hence, its growth rate can be made higher, and the surface of the second crystal layer 20 can be made close to a flat surface. The step between the upper surface 14a of the first crystal layer 14 and the upper surface 10a of the substrate 10 can be made smaller than the step of the step portion 10d of the substrate 10. This facilitates suppressing the growth of the abnormal growth region.

For crystal growth, for instance, the MOCVD (metal organic chemical vapor deposition) method can be used. More specifically, the growth raw material can include e.g. TMG (trimethylgallium), TMA (trimethylaluminum), TMI (trimethylindium), and ammonia. As a p-type doping raw material, Cp$_2$Mg (bis(cyclopentadienyl)magnesium) can be used. As an n-type doping raw material, monosilane (SiH$_4$), for instance, can be used. For the crystal growth process, the MBE (molecular beam epitaxy) method may also be used.

Here, the upper surface 10a of the substrate 10 may be the upper surface of protrusions provided periodically like stripes or islands. In this case, the step portion 10d is provided around the protrusion. In such a periodic structure, the raw material spreads to the step lower surface 10b from many directions. Hence, the growth rate can be made higher, and the crystal defect region can be made smaller.

Figure 5:
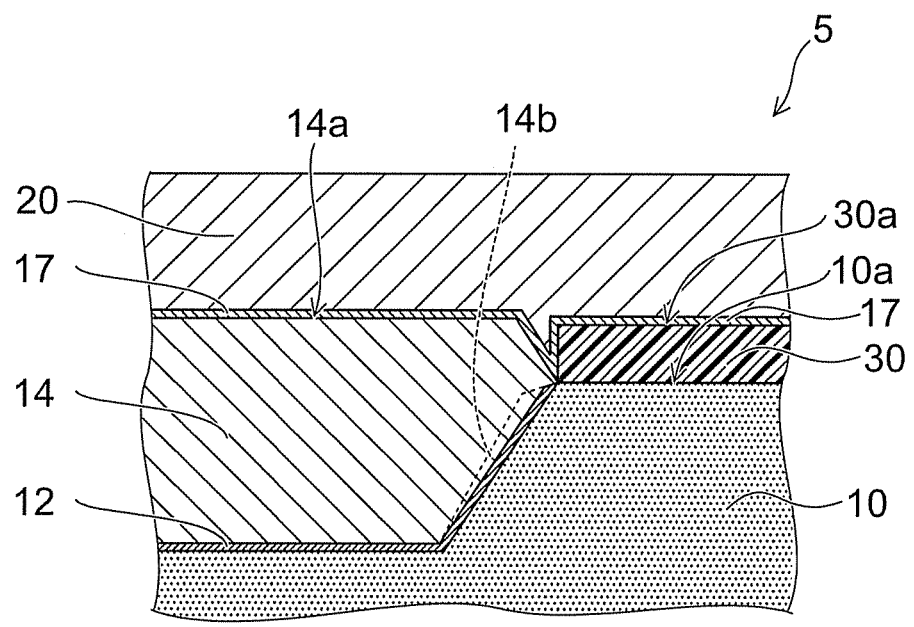
FIG. 5 is a schematic sectional view of a nitride semiconductor stacked structure according to a second embodiment.

FIG. 5 is a schematic sectional view of a nitride semiconductor stacked structure according to a second embodiment.

In the second embodiment, after the process of forming the first buffer layer 12 and the first crystal layer 14, the selective growth mask layer 30 is not removed. Thus, a second buffer layer 17 and a second crystal layer 20 are provided on the upper surface 14a of the first crystal layer 14 and the upper surface 30a of the selective growth mask layer 30. The step between the upper surface 14a of the first crystal layer 14 and the upper surface 30a of the selective growth mask layer 30 is small. Thus, on a more flat nitride semiconductor stacked structure 5, a flat nitride semiconductor stacked body can be provided more easily.

FIG. 6A to FIG. 6E are process sectional views of a method for manufacturing the nitride semiconductor stacked structure of the second embodiment.

Figure 6A:
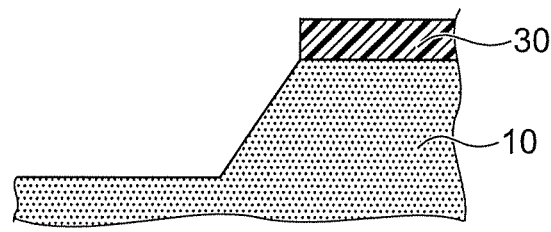
FIG. 6A to FIG. 6E are process sectional views of a method for manufacturing the nitride semiconductor stacked structure of the second embodiment.
Figure 6B:
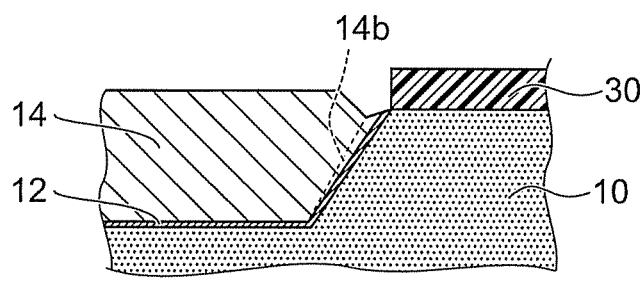
Figure 6C:
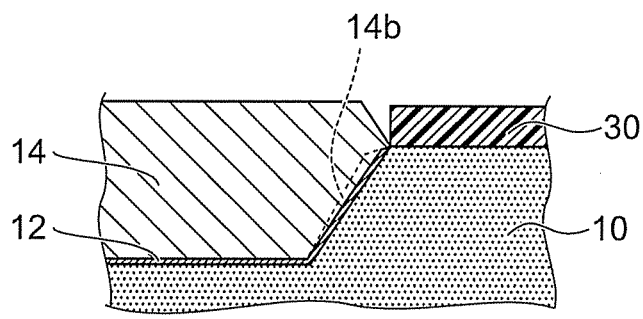
Figure 6D:
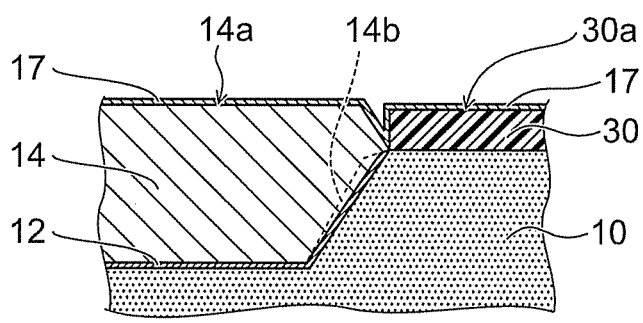
Figure 6E:
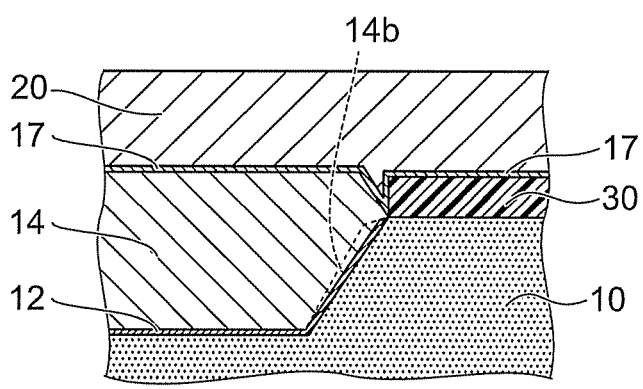

In FIG. 6A, the thickness of the substrate 10 made of sapphire is e.g. 150 μm. A first buffer layer 12 including GaN is formed on the step lower surface 10b and the step side surface 10c. The first buffer layer 12 is formed to a thickness of e.g. 0.03 μm at a temperature lower than the crystal growth temperature of the single crystal nitride semiconductor to be provided thereon. Here, the crystal growth condition is preferably such that the first buffer layer 12 is not substantially formed on the upper surface 30a of the selective growth mask layer 30. Next, a first crystal layer 14 including e.g. GaN is formed on the upper surface 12a of the first buffer layer 12 at 1000° C. or more, which is the crystal growth temperature. FIG. 6B shows an intermediate point of the crystal growth process. As shown in FIG. 6C, the first crystal layer 14 is formed so that the height of its upper surface is made generally equal to the height of the upper surface of the selective growth mask layer 30 made of e.g. SiO$_2$. In FIG. 6D, a second buffer layer 17 including AlN is formed on the upper surface 14a of the first crystal layer 14 and the upper surface 30a of the selective growth mask layer 30. The second buffer layer 17 is formed at a temperature lower than the formation temperature of the first crystal layer 14. The thickness of the second buffer layer 17 is set to e.g. 0.03 μm. Because AlN has low growth selectivity, the second buffer layer 17 can be formed entirely, including the upper surface of the selective growth mask layer 30 and the first crystal layer 14. Furthermore, a second crystal layer 20 including e.g. GaN is formed on the upper surface of the second buffer layer 17 to a thickness of e.g. 2 μm. The growth temperature of the second crystal layer 20 is made higher than any of the temperature for forming the first buffer layer 12 and the temperature for forming the second buffer layer 17, and is set to 1000° C. or more, which is a temperature enabling crystal growth.

Here, the selective growth mask layer 30 made of e.g. SiO$_2$ is not removed. Thus, in the process for manufacturing the nitride semiconductor stacked structure 5, the layers from the first buffer layer 12 to the second crystal layer 20 can be formed in a single crystal growth process. This can shorten the process and increase the volume productivity. Here, inventors' experiments have revealed that in the second buffer layer 17, Al$_x$Ga$_{1-x}$N with the Al composition ratio x being 0.6 or more (0.65≤x<1) can achieve an effect similar to that of AlN.

Next, a nitride semiconductor device of the embodiment is described.

Figure 7:
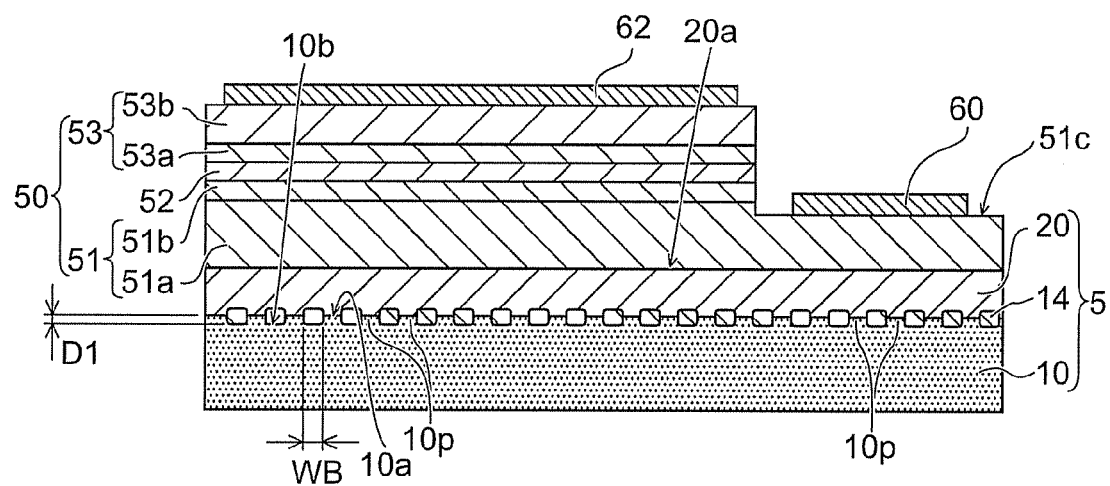
FIG. 7 is a schematic sectional view of a nitride semiconductor device of the embodiment.

FIG. 7 is a schematic sectional view of a light emitting device as an example of the nitride semiconductor device of the embodiment. In the light emitting device, a stacked body made of nitride semiconductors is provided on the surface of a nitride semiconductor stacked structure.

The stacked body 50 made of nitride semiconductors is provided on the upper surface 20a of the second crystal layer 20 of the nitride semiconductor stacked structure 5 shown in FIGS. 1A and 1B or FIG. 5. The stacked body 50 includes a first layer 51 having a first conductivity type, an active layer 52, and a second layer 53 having a second conductivity type in this order from the nitride semiconductor stacked structure 5 side.

On the sapphire substrate 10, protrusions 10p shaped like islands or stripes are periodically arranged, and a step portion is provided around the protrusion 10p. For instance, in a preferable periodic structure, the width WB of the step lower surface 10b is 5 μm or less, the height D1 of the step portion is 2 μm or less, and the growth rate is 10 μm/hour or less. Furthermore, in a more preferable periodic structure, the width WB of the step lower surface 10b is 2 μm or less, the height D1 of the step portion is 1 μm or less, and the growth rate is 5 μm/hour or less. It is noted that this figure does not show the first buffer layer and the second buffer layer. The concave-convex surface located between the sapphire substrate 10 and the crystal layer can change the total reflection angle at the interface of emission light from the active layer 52 as compared with the case of the flat surface. Hence, the light extraction efficiency of the nitride semiconductor device can be increased.

The first layer, 51 includes e.g. a contact layer 51a made of GaN and a first cladding layer 51b. The second layer 53 includes e.g. a second cladding layer 53a made of e.g. Al$_{0.2}$Ga$_{0.8}$N and a contact layer 53b made of e.g. GaN.

The active layer 52 provided between the first cladding layer 51b and the second cladding layer 53a has e.g. an MQW (multi-quantum well) structure composed of well layers made of In$_{0.05}$Ga$_{0.95}$N (thickness 0.003 μm) and barrier layers made of GaN (thickness 0.006 μm). The number of wells can be set to e.g. 20.

A step portion is provided in the first layer 51. The contact layer 51a is exposed at the step bottom surface 51c. A first electrode 60 is provided on the step bottom surface 51c. The current flows between the first electrode 60 and a second electrode 62. More specifically, the first buffer layer 12, the first crystal layer 14, the second buffer layer 16, and the second crystal layer 20 do not need to constitute a current path. Hence, the conductivity type thereof may be p-type, n-type, or non-doped. On the other hand, a second electrode 62 is provided on the contact layer 53b of the second layer 53. The second electrode 62 is preferably transmissive to emission light from the active layer 52. For instance, use of e.g. a metal thin film or transparent electrode facilitates increasing the transmittance.

If the first conductivity type is n-type, then the first electrode 60 is an n-side electrode, the second conductivity type is p-type, and the second electrode 62 is a p-side electrode. Here, the stacked body 50 can be formed by e.g. the MOCVD method continuously subsequent to the crystal growth process of the nitride semiconductor stacked structure 5.

The light emitting device shown in FIG. 7 achieved an optical output of 10 mW at an operating current of 20 mA for a light emission wavelength of 380 nm. Under the same operating condition, the optical output of the comparative example of FIG. 2 is 5 mW. Hence, the optical output was increased generally twice. Here, a concave-convex structure provided at the light extraction surface can further increase the optical output.

Furthermore, the electrostatic breakdown voltage for the human body model was 2000 V, improved from 500 V in the comparative example.

The selective growth mask layer 30 may be made of other insulating films or metals. For instance, the selective growth mask layer 30 can be made of e.g. an Si$_3$N$_4$ layer. For instance, at a wavelength of 450 nm, the refractive index of Si$_3$N$_4$ is 1.92, which is higher than that of SiO$_2$ (refractive index: 1.46) and falls within the range between the refractive index of sapphire, 1.78, and the refractive index of GaN, 2.49. This can increase light which can be extracted on the side of the transparent substrate such as a sapphire substrate.

In a nitride light emitting device, increase of crystal defects often decreases the optical output and electrostatic breakdown voltage. In contrast, in the embodiment, a light emitting device with reduced crystal defects can be easily obtained. Thus, while maintaining high optical output, the electrostatic breakdown voltage can be improved. Such light emitting devices can emit light in the visible light wavelength range, and can be widely used for e.g. illumination devices, display devices, and traffic signals.

Furthermore, an electronic device such as HEMT (high electron mobility transistor) and HBT (heterobipolar transistor) can be provided in the stacked body. In this case, the electrostatic breakdown voltage of the electronic device can be increased, and the reliability can be improved.

Furthermore, use of the method for manufacturing a nitride semiconductor stacked structure according to the embodiments facilitates reducing the crystal defect density. This can realize a manufacturing method with higher device yield and higher volume productivity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor stacked structure having a first surface on which a semiconductor including In$_x$Al$_y$Ga$_{1-x-y}$N (0≤x≤1, 0≤y≤1, x+y≤1) can be stacked, the structure comprising:
   a substrate having a step portion, the step portion including an upper surface, a lower surface, and a side surface between the upper surface and the lower surface;
   a first buffer layer including In$_s$Al$_t$Ga$_{1-s-t}$N (0≤s≤0.05, 0≤t≤1) and covering the lower surface and the side surface;
   a first crystal layer provided on the first buffer layer, including In$_s$Al$_t$Ga$_{1-s-t}$N (0≤s≤0.05, 0≤t≤0.05), and having an upper surface provided above the upper surface of the substrate;
   a second buffer layer including In$_s$Al$_t$Ga$_{1-s-t}$N (0≤s≤0.05, 0≤t≤1) and continuously covering the upper surface of the first crystal layer and the upper surface of the substrate; and
   a second crystal layer covering the second buffer layer, including In$_s$Al$_t$Ga$_{1-s-t}$N (0≤s≤0.05, 0≤t≤0.05), and having the first surface.

2. The structure according to claim 1, wherein a height of the step portion of the substrate is smaller than sum of a thickness of the first buffer layer and a thickness of the first crystal layer, and larger than a height difference between the upper surface of the first crystal layer and the upper surface of the substrate.

3. The structure according to claim 1, wherein the substrate is made of a hexagonal material, and the upper surface and the lower surface of the substrate are c-planes.

4. The structure according to claim 1, wherein
   the upper surface of the substrate is an upper surface of protrusions provided periodically in a direction parallel to the first surface, and the side surface of the step portion is a side surface of the protrusions.

5. The structure according to claim 4, wherein the protrusions are shaped like islands or stripes.

6. A nitride semiconductor stacked structure having a first surface on which a semiconductor including In$_x$Al$_y$Ga$_{1-x-y}$N (0≤x≤1, 0≤y≤1, x+y≤1) can be stacked, the structure comprising:
   a substrate having a step portion, the step portion including an upper surface, a lower surface, and a side surface between the upper surface and the lower surface;
   a first buffer layer including In$_s$Al$_t$Ga$_{1-s-t}$N (0≤s≤0.05, 0≤t≤1) and covering the lower surface and the side surface;
   a first crystal layer provided on the first buffer layer, including In$_s$Al$_t$Ga$_{1-s-t}$N (0≤s≤0.05, 0≤t≤0.05), and having an upper surface provided above the upper surface of the substrate;
   a selective growth mask layer provided on the upper surface of the substrate;

a second buffer layer including $Al_wGa_{1-w}N$ ($0.6 \leq w \leq 1$) and continuously covering the upper surface of the first crystal layer and an upper surface of the selective growth mask layer; and a second crystal layer covering the second buffer layer, including $In_sAl_tGa_{1-s-t}N$ ($0 \leq s \leq 0.05$, $0 \leq t \leq 0.05$), and having the first surface.

7. The structure according to claim 6, wherein a height of the step portion of the substrate is smaller than sum of a thickness of the first buffer layer and a thickness of the first crystal layer, and larger than a height difference between the upper surface of the first crystal layer and the upper surface of the substrate.

8. The structure according to claim 6, wherein the substrate is made of a hexagonal material, and the upper surface and the lower surface of the substrate are c-planes.

9. The structure according to claim 6, wherein
the upper surface of the substrate is an upper surface of protrusions provided periodically in a direction parallel to the first surface, and
the side surface of the step portion is a side surface of the protrusions.

10. The structure according to claim 9, wherein the protrusions are shaped like islands or stripes.

11. The structure according to claim 6, wherein the selective growth mask layer includes an insulating film or a metal film.

12. A nitride semiconductor device comprising:
a nitride semiconductor stacked structure including:
a substrate having a step portion, the step portion including an upper surface, a lower surface, and a side surface between the upper surface and the lower surface;
a first buffer layer including $In_sAl_tGa_{1-s-t}N$ ($0 \leq s \leq 0.05$, $0 \leq t \leq 1$) and covering the lower surface and the side surface;
a first crystal layer provided on the first buffer layer, including $In_sAl_tGa_{1-s-t}N$ ($0 \leq s \leq 0.05$, $1 \leq t \leq 0.05$), and having an upper surface provided above the upper surface of the substrate;
a second buffer layer including $In_sAl_tGa_{1-s-t}N$ ($0 \leq s \leq 0.05$, $0 \leq t \leq 1$) and continuously covering the upper surface of the first crystal layer and the upper surface of the substrate; and
a second crystal layer covering the second buffer layer and including $In_sAl_tGa_{1-s-t}N$ ($0 \leq s \leq 0.05$, $0 \leq t \leq 0.05$); and
a semiconductor stacked on the second crystal layer and including $In_xAl_yGa_{1-x-y}N$ ($0 \leq x \leq 1$, $0 \leq y \leq 1$, $x+y \leq 1$).

13. The device according to claim 12, wherein
the upper surface of the substrate is an upper surface of protrusions provided periodically in a direction parallel to the first surface and shaped like islands or stripes, and
the side surface of the step portion is a side surface of the protrusions.

14. The device according to claim 13, wherein the semiconductor includes an active layer which can emit light.

15. The device according to claim 13, wherein the substrate is made of a hexagonal material, and the upper surface and the lower surface of the substrate are c-planes.

16. The device according to claim 15, wherein
the upper surface of the substrate is an upper surface of protrusions provided periodically in a direction parallel to the first surface and shaped like islands or stripes, and
the side surface of the step portion is a side surface of the protrusions.

17. The device according to claim 16, wherein the semiconductor includes an active layer which can emit light.

* * * * *